United States Patent [19]

Shuholm

[11] Patent Number: 5,859,549
[45] Date of Patent: Jan. 12, 1999

[54] DIGITAL AUDIO FRAME AND BLOCK SYNCHRONIZATION

[75] Inventor: Kevin J. Shuholm, Grass Valley, Calif.

[73] Assignee: Tektronix, Inc., Wilsonville, Oreg.

[21] Appl. No.: 874,527

[22] Filed: Jun. 13, 1997

[51] Int. Cl.[6] .................................................. H03L 7/06
[52] U.S. Cl. ........................................ 327/151; 327/156
[58] Field of Search .................................... 327/141, 142, 327/146–151, 155–160, 175; 331/17, DIG. 2; 375/373, 375, 376

[56] References Cited

U.S. PATENT DOCUMENTS

| | | | |
|---|---|---|---|
| 5,012,198 | 4/1991 | Okada et al. | 327/151 |
| 5,170,135 | 12/1992 | Ito et al. | 331/1 A |
| 5,455,840 | 10/1995 | Nakauchi et al. | 327/147 |
| 5,694,089 | 12/1997 | Adachi et al. | 327/147 |

*Primary Examiner*—My-Trang Nu Ton
*Attorney, Agent, or Firm*—Francis I. Gray

[57] ABSTRACT

A digital audio frame and block synchronization signal is generated from a reference clock having a nominal 50% duty cycle except that one out of every N cycles has a different duty cycle, where N corresponds to a block span of ancillary data within the frame samples of the digital audio. A phase locked loop includes a loop counter that provides a sample clock synchronized with the reference clock. A block counter subdivides the sample clock by N to produce a block clock. A logic circuit has the reference clock and a current count from the loop counter as inputs, and detects when the Nth non-50% duty cycle occurs to generate a reset signal. The reset signal is used to reset the block counter so that the block clock is synchronized with the reference clock.

6 Claims, 4 Drawing Sheets

DIGITAL AUDIO FRAME AND BLOCK SYNCHONIZATION

CROSS-REFERENCE TO RELATED APPLICATIONS

Not applicable

STATEMENT REGARDING FEDERALLY SPONSORED RESEARCH OR DEVELOPMENT

Not applicable

BACKGROUND OF THE INVENTION

The present invention relates to synchronization of serial digital audio signals, and more particularly to a simple digital audio frame and block synchronization using a 50% duty cycle reference signal with a different duty cycle every Nth cycle corresponding to the block span.

An internationally known standard for the interchange of digital audio is AES3-1992. Under this standard two channels of audio are digitized and then time multiplexed into a single serial digital data stream. This data stream contains certain synchronizing symbols, or preambles, that are used by a receiver of the data stream to demultiplex and deserialize the two digital audio channels. In addition to the digitized audio samples, each sample within the data stream also contains auxiliary information in the form of a channel status bit, a user data bit, a validity bit and a parity bit. The validity and parity bits pertain only to the samples in which they are contained, but the channel status and user data bits form blocks of data that span 192 samples. A special preamble in the AES data stream indicates the start of a new 192 sample block.

When it is desirable to synchronize multiple systems, or multiple channels within a system, a reference clock with 50% duty cycle, such as a 48 KHz clock typical for AES, may be distributed. Phase-locked loops (PLLs) in a system may then be connected directly to this clock, as shown in FIG. 1. An oscillator generates a master clock and from the master clock other audio clocks that are multiples of the reference clock. The problem is that no block alignment is made between systems, only frame alignment.

To maintain block alignment an AES signal may be used as the system reference, as shown in FIG. 2. The problem with this approach is that it takes more circuitry and complexity to derive a reference clock from the AES reference signal.

Another possible solution to this problem is to distribute a block reference clock, as shown in FIG. 3. The problem with this approach is that, due to the relatively low frequency of the block reference clock, it is difficult to get a PLL to lock in a brief time period, which eliminates this as a reasonable solution.

What is desired is a simple solution for providing both frame and block synchronization for digital audio signals.

BRIEF SUMMARY OF THE INVENTION

Accordingly the present invention provides digital audio frame and block synchronization by using as a reference clock a nominally 50% duty cycle clock with every Nth cycle, N corresponding to the block span of a digital audio signal, having a different duty cycle. The modified reference clock is input to a phase locked loop (PLL) having a loop divider for a VCO that produces a local sample clock that is compared with the reference clock in the PLL. A reset logic circuit has as inputs the reference clock and a current count output from the loop divider. When the different duty cycle of the reference clock occurs, it is compared with the current count output of the loop divider to generate a reset signal. The reset signal is input to a block divider that outputs a clock signal at the start of every block of audio samples to synchronize the block start of the sampled audio data.

The objects, advantages and other novel features of the present invention are apparent from the following detailed description when read in conjunction with the appended claims and attached drawing.

DETAILED DESCRIPTION OF THE INVENTION

Figure 1:
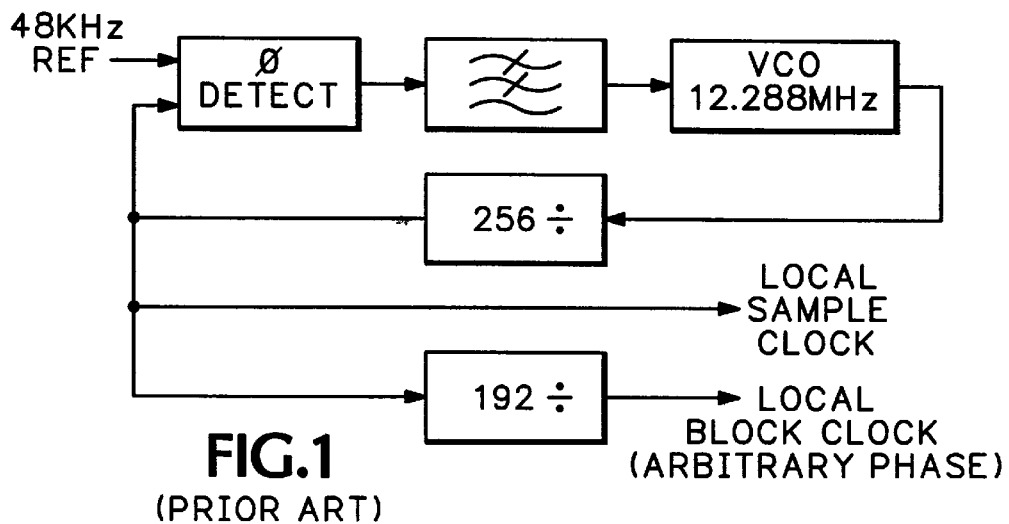
FIG. 1 is a block diagram view of a first system for generating sample clocks from a reference sample clock.
Figure 2:
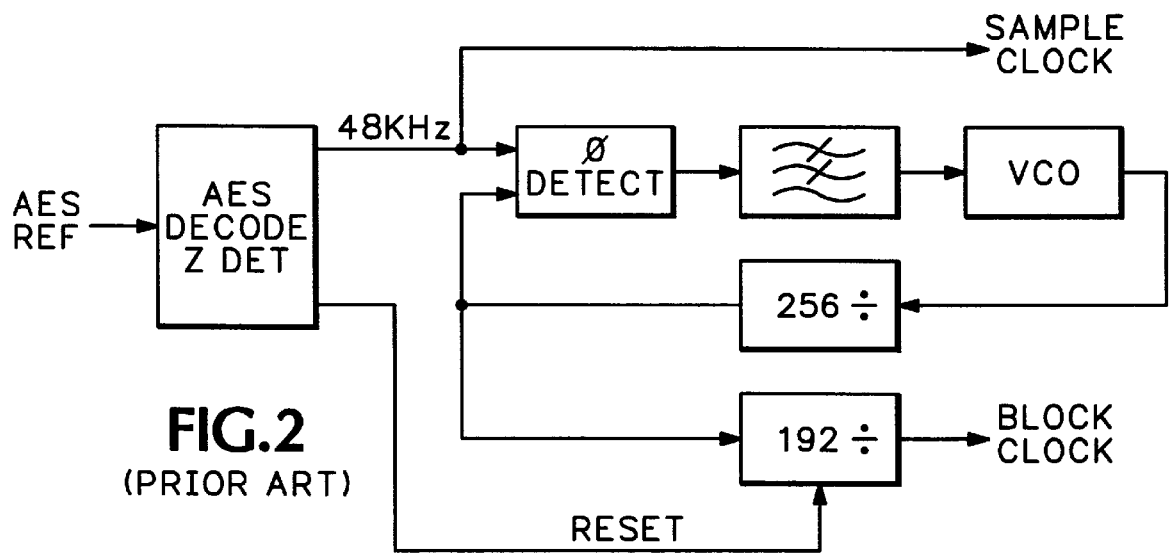
FIG. 2 is a block diagram view of a second system for generating sample clocks from an AES signal.
Figure 3:
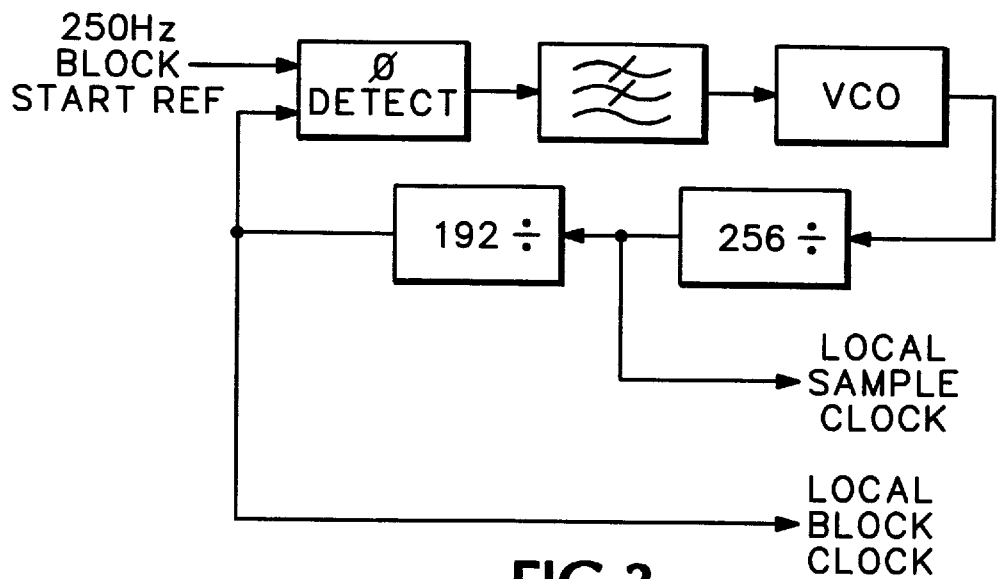
FIG. 3 is a block diagram view of a third system for generating sample clocks from a reference block sample clock.
Figure 4:
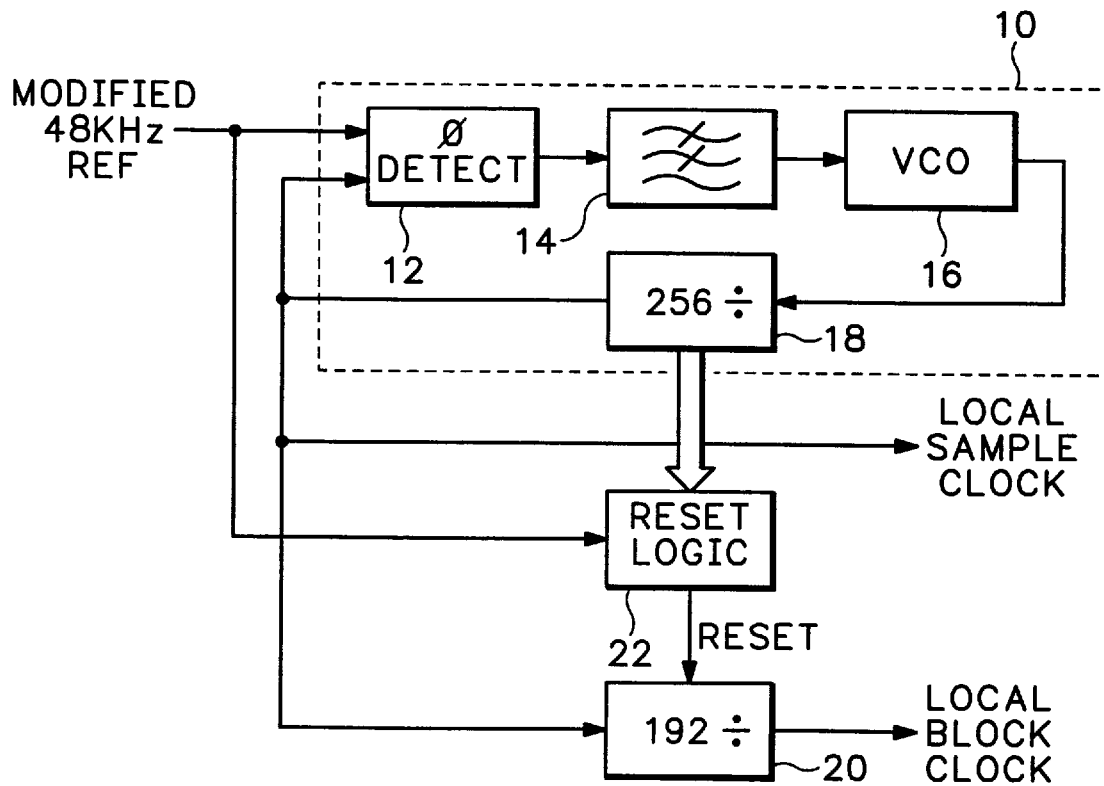
FIG. 4 is a block diagram view of a system for digital audio frame and block synchronization according to the present invention.

Referring now to FIG. 4 a reference clock, which has the same frequency as a digital audio signal's sample rate and a nominally fifty percent (50%) duty cycle, is input to a phase locked loop (PLL) 10. For every Nth cycle the duty cycle of the reference clock is changed, where N corresponds to the block span of the ancillary data in the digital audio signal. The PLL 10 has an input phase detector 12 followed by a loop lowpass filter 14 which generates a control signal for a voltage controlled oscillator (VCO) 16. The output of the VCO 16 is divided by a loop divider 18 to provide a local sample clock which also serves as the second input to the phase detector 12, completing the PLL 10.

The local sample clock also is input to a block counter 20 that provides a local block clock output. The block counter 20 is synchronized with the block start of the ancillary data in the digital audio signal by a reset signal generated by a reset logic circuit 22. The reset logic circuit 22 has as inputs the reference clock and the count output from the loop counter 18. When the Nth cycle of the reference clock with the modified duty cycle occurs, indicating the block start of the digital audio signal, the reset logic circuit 22 compares the reference clock with the count to detect such modified duty cycle, generating the reset signal as a result.

Figure 5:
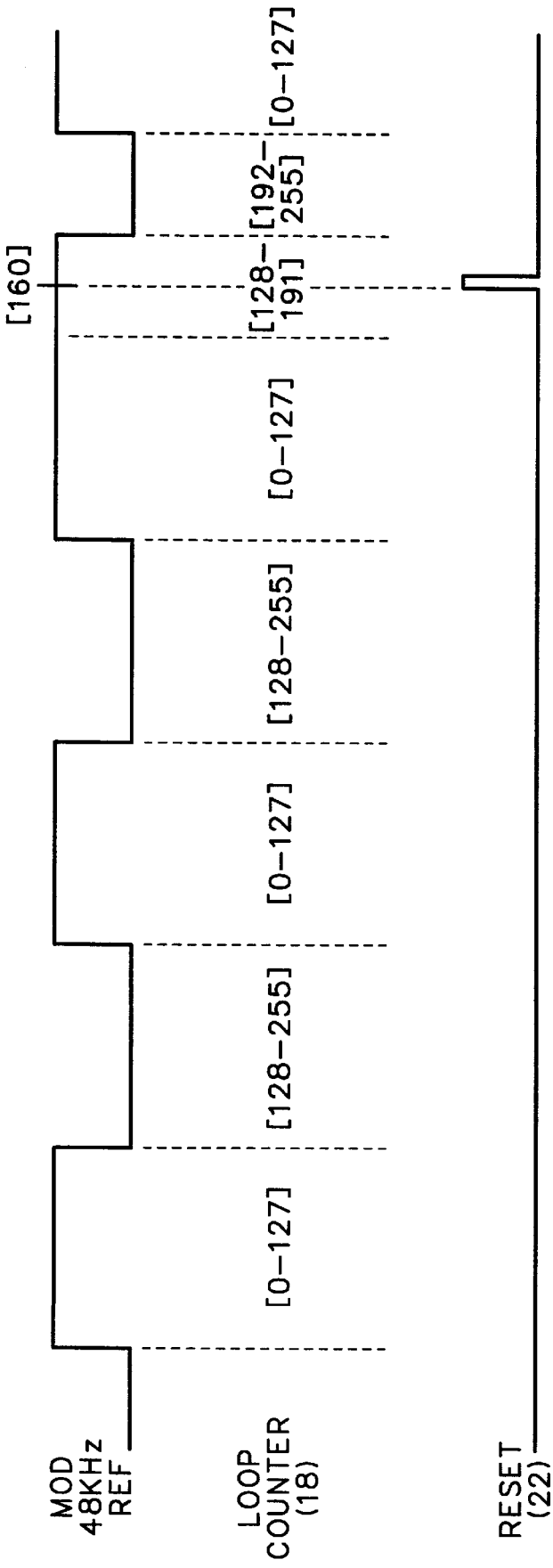
FIG. 5 is a timing diagram view for the system of FIG. 4 according to the present invention.

As shown in FIG. 5 for a nominally 48 KHz reference clock that produces a 48 KHz local sample clock from the loop counter 18 and a 250 Hz local block clock from the block counter 20, the frequency of the VCO 16 is 12.288 MHz, the divisor for the loop counter 18 is 256 and the divisor for the block counter 20 is 192, corresponding to a block span of 192 audio frame samples. For the normal 50% duty cycles of the reference clock, count outputs between 0–127 from the loop counter 18 correspond to the high portion of the duty cycle (logical "1"), and count outputs between 128–255 correspond to the low portion of the duty cycle (logical "0"). In the current example the duty cycle for the block start reference duty cycle of the reference clock, the Nth cycle, is 75%/25%, i.e., it is a logical "1" for 75% of the cycle and a logical "0" for 25% of the cycle. For the period between 50% and 75% of the duty cycle the count from the loop counter 18 is nominally in the range of 128–191. Therefore when the count from the loop counter 18 is within the range of 128–191, such as the midpoint at count 160, and the logic level for the reference clock due to the modified duty cycle is a logical "1", the reset signal is generated to reset the block counter 20 and thus provide block clock synchronization.

Figure 6:
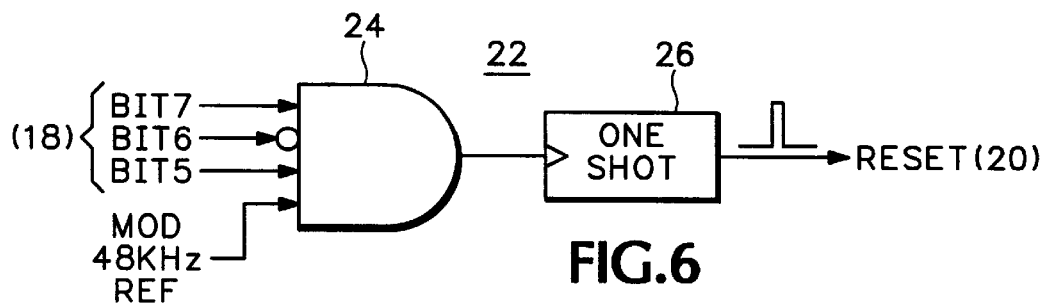
FIG. 6 is a simple block diagram view of a reset logic circuit for the system of FIG. 4 according to the present invention.

A simple version of the reset logic circuit 22 is shown in FIG. 6. Bits 5, 6 and 7 from the loop counter 18, corresponding to the count of 160, are input to an AND gate 24, with bit 6 being inverted. Bit 7 and inverted bit 6 cover the range of counts between 128 and 191 and bit 5 establishes the count at 160 within that range. The reference signal also is input to the AND gate 24. The output of the AND gate 24 is used to trigger a one-shot multivibrator 26 that has a pulse width output shorter than the reference clock cycle. The output of the one-shot multivibrator 26 is the reset signal for the block counter 20.

Figure 7:
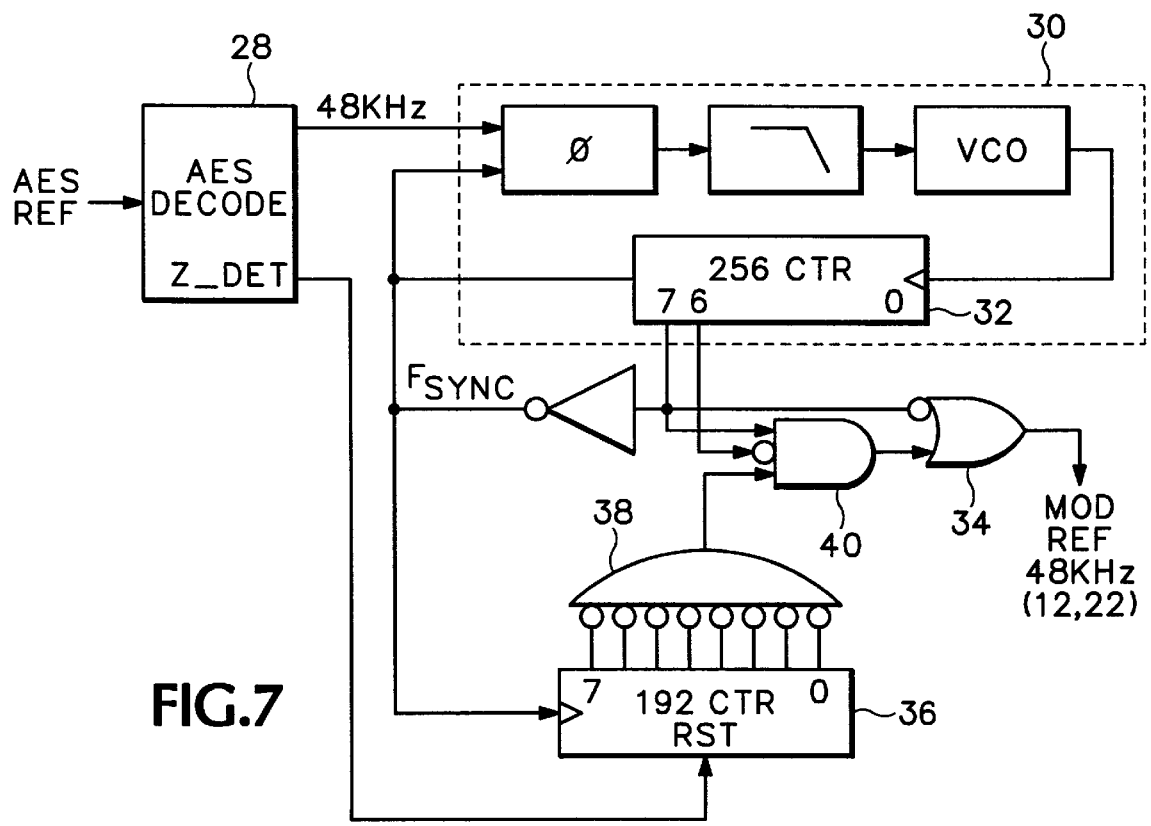
FIG. 7 is a block diagram of a clock generator for producing the reference clock according to the present invention.

One method of generating the reference clock is shown in FIG. 7. The modified reference clock is derived from a normal, unmodified reference clock, Fsync, that is output from a phase locked loop 30 that has as an input the 48 kHz reference derived from the AES bit stream using a standard AES decoder 28. Fsync corresponds to the inverted bit 7 of the divide-by-256 counter 32 that is part of the PLL 30. Fsync also is the modified reference clock via an OR gate 34. When the AES decoder 28 detects the start of an audio block in the AES stream, the Z_det output becomes a logical "1" and is used to reset a divide-by-192 counter 36 that is clocked by Fsync. When the output of the counter 36 is zero, an enable signal via AND gate 38 is applied to an output AND gate 40. The other inputs to output AND gate 40 are bit 7 and inverted bit 6 from counter 32. The output of AND gate 40 is high during counts 128–191 while inverted bit 7 (Fsync) is high during counts 0–127. The result is that when counter 36 is reset at the beginning of the audio block, the modified reference clock has a duty cycle that is high from count 0–191 and low from count 192–255, while all other duty cycles are high from counts 0–127 and low from counts 128–255, thus providing the one duty cycle out of 192 that is 75/25 where the remainder are 50/50.

Thus the present invention provides a digital audio frame and block synchronization signal by using a reference clock that has a nominally 50% duty cycle where every Nth duty cycle is modified, N being the block span, and the unique, non-50% duty cycle is detected to generate a synchronized block clock.

I claim:

1. An apparatus comprising:

means for generating from a reference clock a sample clock synchronized with the reference clock, the reference clock having a nominal 50% duty cycle with every Nth cycle having a duty cycle different than 50%;

a block counter for dividing the sample clock by N to produce a block clock; and detecting means coupled to the generating means and the reference clock for detecting the Nth cycle of the reference clock to produce a reset signal for the block counter so that the block clock is synchronized with the Nth cycle of the reference clock.

2. The apparatus as recited in claim 1 wherein the generating means comprises a phase locked loop having a phase detector with the reference clock and the sample clock as inputs, a loop filter coupled to the output of the phase detector to produce a control signal, a voltage controlled oscillator controlled by the control signal to produce a master clock, and a loop counter to produce the sample clock from the master clock.

3. The apparatus as recited in claim 2 wherein the detecting means comprises a logic circuit having as inputs a count from the loop counter and the reference clock and producing as an output the reset signal when the Nth cycle occurs.

4. The apparatus as recited in claim 1 further comprising means for synthesizing from an input data signal the reference clock having the nominal duty cycle of 50% with every Nth cycle having the duty cycle different than 50%.

5. The apparatus as recited in claim 4 wherein the synthesizing means comprises:

a phase locked loop having as an input a system clock derived from the input data signal to produce an unmodified reference clock having a 50% duty cycle; and modifying means coupled to the phase locked loop having as inputs the unmodified reference clock and a reset signal associated with the input data signal for modifying the unmodified reference clock to produce the reference clock.

6. The apparatus as recited in claim 5 wherein the modifying means comprises:

a counter having as inputs the unmodified reference clock and the reset signal, the counter counting the cycles of the unmodified reference clock to produce an output signal;

a first logic circuit coupled to receive the output signal from the counter so as to produce an enable signal when the reset signal resets the counter to a zero count every Nth cycle of the unmodified reference clock; and a second logic circuit having as inputs the unmodified reference clock, the enable signal and a count from a loop counter in the phase locked loop to produce the reference clock having the nominal 50% duty cycle with every Nth cycle having the duty cycle different than 50%.

\* \* \* \* \*